US010858757B2

(12) United States Patent
Tanaka et al.

(10) Patent No.: US 10,858,757 B2
(45) Date of Patent: Dec. 8, 2020

(54) SILICON CARBIDE EPITAXIAL SUBSTRATE AND SILICON CARBIDE SEMICONDUCTOR DEVICE

(71) Applicant: Mitsubishi Electric Corporation, Chiyoda-ku (JP)

(72) Inventors: Takanori Tanaka, Tokyo (JP); Shigehisa Yamamoto, Tokyo (JP); Yu Nakamura, Tokyo (JP); Yasuhiro Kimura, Tokyo (JP); Shuhei Nakata, Tokyo (JP); Yoichiro Mitani, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 61 days.

(21) Appl. No.: 16/097,966

(22) PCT Filed: May 9, 2017

(86) PCT No.: PCT/JP2017/017528
§ 371 (c)(1),
(2) Date: Oct. 31, 2018

(87) PCT Pub. No.: WO2017/199792
PCT Pub. Date: Nov. 23, 2017

(65) Prior Publication Data
US 2019/0145021 A1    May 16, 2019

(30) Foreign Application Priority Data

May 20, 2016    (JP) ................................ 2016-101045

(51) Int. Cl.
*H01L 29/15*    (2006.01)
*C30B 29/36*    (2006.01)
(Continued)

(52) U.S. Cl.
CPC .............. *C30B 29/36* (2013.01); *H01L 21/20* (2013.01); *H01L 21/205* (2013.01); *H01L 29/12* (2013.01); *H01L 29/78* (2013.01)

(58) Field of Classification Search
CPC ....... H01L 29/12; H01L 29/32; H01L 29/648; H01L 29/808; H01L 29/66068; H01L 29/03
See application file for complete search history.

(56) References Cited

U.S. PATENT DOCUMENTS

2008/0079008 A1    4/2008   Yonezawa et al.
2008/0163814 A1*   7/2008   Kim .................... H01L 21/0254
                                                              117/95
(Continued)

FOREIGN PATENT DOCUMENTS

DE    10 2008 037 357 A1    4/2009
JP            2008-91656 A   4/2008
(Continued)

OTHER PUBLICATIONS

International Search Report dated Aug. 15, 2017 in PCT/JP2017/017528 filed May 9, 2017.
(Continued)

*Primary Examiner* — Phuc T Dang
(74) *Attorney, Agent, or Firm* — Xsensus LLP

(57) ABSTRACT

An epitaxial substrate includes a single-crystal substrate of silicon carbide, and an epitaxial layer of silicon carbide disposed on the single-crystal substrate. The epitaxial layer includes a first epitaxial layer disposed on the single-crystal substrate, a second epitaxial layer disposed on the first epitaxial layer, and a third epitaxial layer disposed on the second epitaxial layer. The first epitaxial layer has a basal-
(Continued)

plane-dislocation conversion rate of less than 95%. The second epitaxial layer has a basal-plane-dislocation conversion rate of more than 98%.

8 Claims, 3 Drawing Sheets

(51) Int. Cl.
*H01L 21/205* (2006.01)
*H01L 29/78* (2006.01)
*H01L 29/12* (2006.01)
*H01L 21/20* (2006.01)

(56) References Cited

U.S. PATENT DOCUMENTS

| | | | |
|---|---|---|---|
| 2009/0085044 A1 | 4/2009 | Ohno et al. | |
| 2009/0302328 A1 | 12/2009 | Ohno et al. | |
| 2011/0006309 A1* | 1/2011 | Momose | C23C 16/325 257/77 |
| 2011/0158277 A1* | 6/2011 | Yoshizumi | B82Y 20/00 372/44.011 |
| 2011/0203513 A1 | 8/2011 | Watanabe et al. | |
| 2012/0056203 A1* | 3/2012 | Fujikawa | H01L 29/1608 257/77 |
| 2013/0029158 A1 | 1/2013 | Aigo et al. | |
| 2015/0311290 A1* | 10/2015 | Kang | H01L 29/7802 257/77 |

FOREIGN PATENT DOCUMENTS

| | | |
|---|---|---|
| JP | 2009-88223 A | 4/2009 |
| JP | 2009-295728 A | 12/2009 |
| JP | 2011-3825 A | 1/2011 |
| JP | 2011-168453 A | 9/2011 |
| JP | 2011-219299 A | 11/2011 |
| JP | 2012-246168 A | 12/2012 |
| JP | 2013-107788 A | 6/2013 |
| JP | 2015-2207 A | 1/2015 |

OTHER PUBLICATIONS

Chen, B. et al., "Electrical and Optical Properties of Stacking Faults in 4H—SiC Devices," Journal of Electronic Materials, vol. 39, No. 6, 2010, pp. 684-687.
Agarwal, A. et al., "A New Degradation Mechanism in High-Voltage SiC Power MOSFETs," IEEE Electron Device Letters, vol. 28, No. 7, Jul. 2007, pp. 587-589.
Zhang, Z. et al., "Mechanism of eliminating basal plane dislocations in SiC thin films by epitaxy on an etched substrate," Applied Physics Letters, vol. 89, No. 081910, Aug. 24, 2006, 4 pages.
Office Action dated Dec. 4, 2018 in corresponding Japanese Patent Application No. 2018-518231 (with English Translation), 7 pages.
German Office Action dated Aug. 24, 2020, issued in corresponding German Patent Application No. 11 2017 002 586.9.

* cited by examiner

STEP FLOW DIRECTION

STEP FLOW DIRECTION

F I G . 6
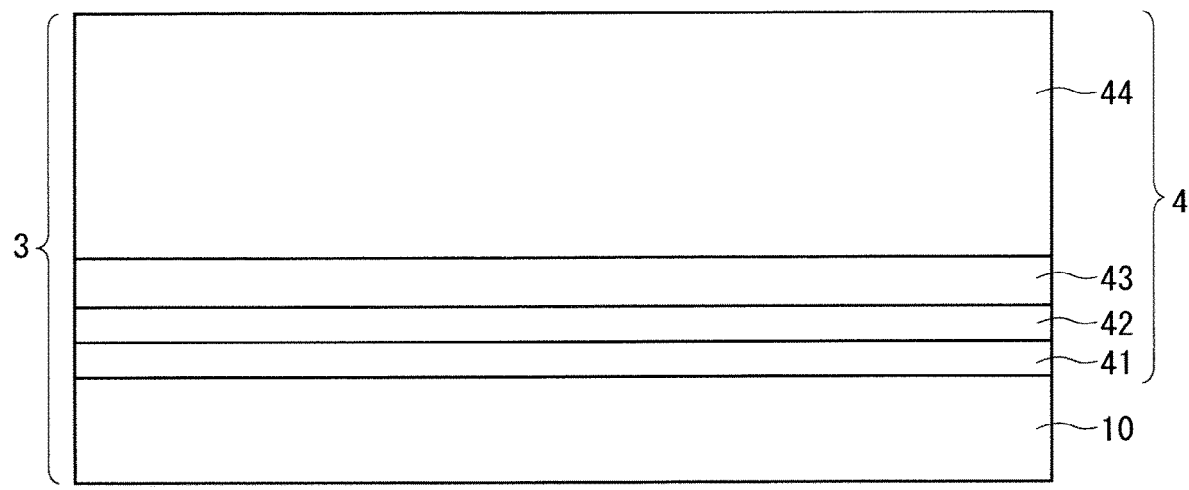

SILICON CARBIDE EPITAXIAL SUBSTRATE AND SILICON CARBIDE SEMICONDUCTOR DEVICE

TECHNICAL FIELD

The present invention relates to silicon carbide epitaxial substrates and silicon carbide semiconductor devices.

BACKGROUND ART

A wide-bandgap semiconductor material, such as silicon carbide (SiC), has higher breakdown strength than a silicon (Si) material. Thus, the use of the wide-bandgap semiconductor material as a substrate material enables the substrate to have a high impurity concentration and a low resistance when compared to the use of the silicon material. The low resistance of the substrate reduces losses during the switching operation of a power element. The wide-bandgap semiconductor material, which has higher heat-conductivity and higher mechanical strength than the silicon material, is a promising material that achieves a small power device with few losses and high efficiency.

In the silicon carbide semiconductor device made of a semiconductor material of silicon carbide, feeding a forward current through a PIN diode structure degrades reliability, that is, a shift in forward voltage (Vf). The shift in forward voltage occurs in the following way.

Upon injected into the PIN diode structure, minority carriers are rejoined to majority carriers. Rejoining energy produced in the rejoining causes a line defect within a silicon carbide crystal (for instance, a basal plane dislocation, a misfit dislocation occurring at the interface between an epitaxial layer and the substrate, and other dislocations) to expand into a stacking fault that is a plane defect originated from the line defect (hereinafter, the stacking fault will be also referred to as an "expanded stacking fault"). The stacking fault acts as a resistor impeding current flow. Hence, an increase in stacking fault equates with a reduction in current and a rise in forward voltage. This causes a shift in forward voltage, thus degrading device properties.

The stacking fault is originated from the line defect, such as the basal plane dislocation or the misfit dislocation, and then expands in triangular form or belt form (e.g., see Non-Patent Document). Such stacking fault expansion occurs along a basal plane (i.e., toward a direction perpendicular to a step flow direction that is an epitaxial growth direction) from the interface between the epitaxial layer and the substrate to a surface of the epitaxial layer. Further, the stacking fault expansion can be originated from a dislocation within an active layer or a dislocation near the surface of the epitaxial layer.

A similar shift in forward voltage resulting from a stacking fault reportedly occurs in a MOSFET made of silicon carbide (hereinafter referred to as a "SiC-MOSFET") as well (e.g., Non-Patent Document 2). A MOSFET structure has a parasitic diode, called a body diode, between a source and a drain. A flow of forward current through the body diode causes degradation similar to that in the PIN diode.

A Schottky barrier diode, across which a relatively low forward voltage is applied, is often used as a freewheeling diode in a switching circuit including, for instance, a SiC-MOSFET. However, a body diode of a SiC-MOSFET, for instance, can be used as a freewheeling diode. Particularly in this instance, the SiC-MOSFET involves a serious problem: a shift in forward voltage across the body diode.

A common semiconductor substrate of silicon carbide includes threading dislocations of the order of $10^3$ cm$^{-2}$ to $10^4$ cm$^{-2}$. These threading dislocations are roughly classified into three types: threading screw dislocations, threading edge dislocations, and basal plane dislocations. The threading screw dislocation and the threading edge dislocation are dislocations proceeding in a c-axis ([0001]) direction. The basal plane dislocation is a dislocation in parallel with a basal plane ({0001} plane). Among these dislocations, some of the basal plane dislocation are known to be converted into the threading edge dislocations by epitaxial growth.

Patent Document 1, listed below, describes a technique for reducing the density of basal plane dislocation in a drift layer. The technique includes forming a layer with a high impurity concentration onto a silicon carbide substrate, forming another layer with a high basal-plane-dislocation conversion rate and a low impurity concentration onto the layer, and forming the drift layer onto the other layer. Patent Document 2, listed below, describes a technique for reducing basal plane dislocations within an epitaxial layer. The technique includes causing temperature to fluctuate during crystal growth in the epitaxial layer to thus apply a thermal stress to the epitaxial layer, and converting, into an edge dislocation, a basal plane dislocation that has been transferred into the epitaxial layer from a silicon carbide substrate.

PRIOR ART DOCUMENTS

Patent Documents

Patent Document 1: Japanese Patent Application Laid-Open No. 2009-088223
Patent Document 2: Japanese Patent Application Laid-Open 2011-219299

Non-Patent Documents

Non-Patent Document 1: Journal of ELECTRONIC MATERIALS, Vol. 39, No. 6, "Electrical and Optical Properties of Stacking Faults in 4H—SiC Devices", 2010
Non-Patent Document 2: IEEE ELECTRON DEVICE LETTERS, VOL. 28, NO. 7, "A New Degradation Mechanism in High-Voltage SiC Power MOSFETs", July 2007
Non-Patent Document 3: Applied Physics Letters, VOL. 89, NO. 081910, "Mechanism of eliminating basal plane dislocations in SiC thin films by epitaxy on an etched substrate", 2006

SUMMARY

Problem to be Solved by the Invention

The technique in Patent Document 1 is directed to reducing the basal plane dislocations within the drift layer by providing a buffer layer with a low impurity concentration. A large difference in impurity concentration at the interface between the substrate and each buffer layer, at the interface between the buffer layer and the drift layer, or at the interfaces between the buffer layers, produces interface dislocations resulting from a stress in the interface. Unfortunately, this can cause device degradation. The technique in Patent Document 2 is directed to converting the basal plane dislocation by applying the thermal stress during the growth in the epitaxial layer. The thermal stress causes interface dislocations in the epitaxial layer. Unfortunately, this can cause device degradation.

To solve the above problem, it is an object of the present invention to reduce not only basal plane dislocations, but also other unfavorable dislocations, such as interface dislocations, thereby preventing the degradation of a bipolar device.

Means to Solve the Problem

A silicon carbide epitaxial substrate according to the present invention includes a silicon carbide single-crystal substrate, a first epitaxial layer disposed on the silicon carbide single-crystal substrate, a second epitaxial layer disposed on the first epitaxial layer, and a third epitaxial layer disposed on the second epitaxial layer. The first epitaxial layer has a basal-plane-dislocation conversion rate of less than 95%. The second epitaxial layer has a basal-plane-dislocation conversion rate of more than 98%.

Effects of the Invention

The silicon carbide epitaxial substrate according to the present invention enables the first and second epitaxial layers with different basal-plane-dislocation conversion rates from each other to gradually convert basal plane dislocations into edge dislocations, thereby reducing unfavorable dislocations originating expanded stacking faults. Accordingly, the third epitaxial layer on the second epitaxial layer has reduced dislocations originating the expanded stacking faults. This prevents stacking fault expansion. Thus, using the third epitaxial layer or a different epitaxial layer disposed thereon as a drift layer of a semiconductor device achieves a highly reliable semiconductor device having stable properties. In addition, extreme change in concentration within the epitaxial layer or temperature change during growth in the epitaxial layer is not required. This prevents an interface dislocation resulting from a stress, thereby preventing the degradation of the semiconductor device.

BRIEF DESCRIPTION OF DRAWINGS

FIG. 6 is a diagram illustrating a modification of the epitaxial substrate according to the embodiment of the present invention.

DESCRIPTION OF EMBODIMENT(S)

Figure 1:
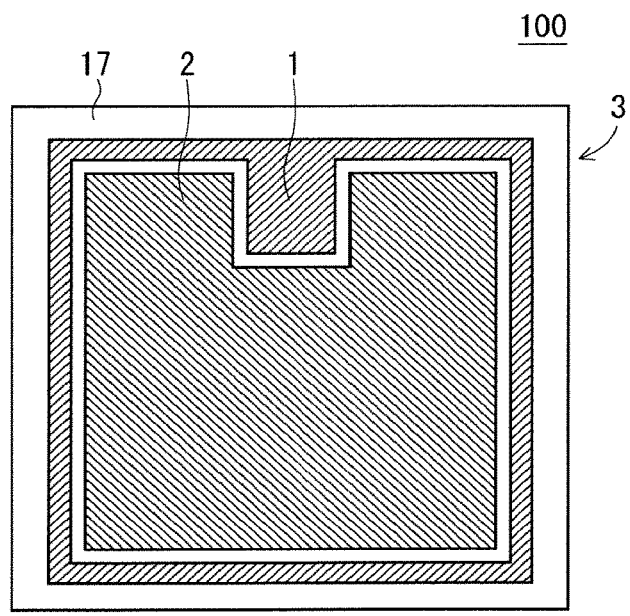
FIG. 1 is a plan view of the configuration of a MOSFET, a silicon carbide semiconductor device, according to an embodiment of the present invention.
Figure 2:
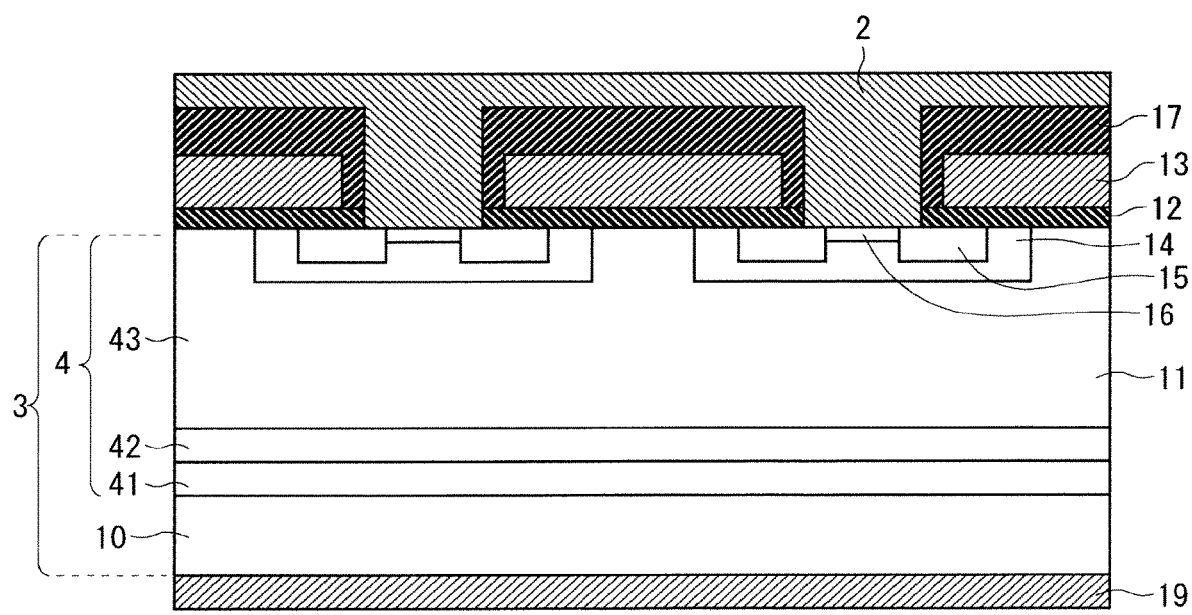
FIG. 2 is a cross-sectional view of the configuration of the MOSFET according to the embodiment of the present invention.

FIGS. 1 and 2 are diagrams illustrating the configuration of a MOSFET 100, which is a silicon carbide semiconductor device, according to an embodiment of the present invention. FIG. 1 is a plan view of the MOSFET 100. FIG. 2 is a cross-sectional view of part of a cell region in the MOSFET 100, and illustrates the cross-sectional structure of a MOSFET cell located in the cell region.

The present embodiment describes a first conductivity type as an n-type, and a second conductivity type as a p-type. However, the first conductivity type may be a p-type, and the second conductivity type may be an n-type. Examples of an n-type impurity include nitride (N), phosphorus (P), arsenic (As), and antimony (Sb). Examples of a p-type impurity include aluminum (Al), boron (B), gallium (Ga), and indium (In).

The MOSFET 100 in the present embodiment is formed of an epitaxial substrate 3 composed of a single-crystal substrate 10 and an epitaxial layer 4 disposed thereon. The single-crystal substrate 10 and the epitaxial layer 4 are made of silicon carbide of a first conductivity type (herein an n-type).

The epitaxial substrate 3 has a hexagonal, crystalline structure. An example of polytypes is 4H. The single-crystal substrate 10 has an impurity concentration of $3 \times 10^{18}$ cm$^{-3}$ or more. Moreover, the single-crystal substrate 10 has an upper surface (a surface adjacent to the epitaxial layer 4) whose plane orientation has an off-angle above 0° with respect to a c-plane ({0001} plane). The c-plane may be any of a carbon plane (C plane) and a silicon plane (Si plane). The off-angle is preferably 1° or more and 8° or less.

The epitaxial layer 4 is disposed on the upper surface of the single-crystal substrate 10, and has a stacked structure composed of a first epitaxial layer 41, a second epitaxial layer 42, and a third epitaxial layer 43. The first epitaxial layer 41, the second epitaxial layer 42, and the third epitaxial layer 43 are arranged, in this sequence, on the lower surface of the epitaxial layer 4 (a surface adjacent to the single-crystal substrate 10). The epitaxial layer 4 has an upper surface (a surface remote from the single-crystal substrate 10) whose plane orientation is the same as that of the upper surface of the single-crystal substrate 10.

The first epitaxial layer 41 and the second epitaxial layer 42 of the epitaxial layer 4 constitute a buffer layer of the MOSFET 100. The third epitaxial layer 43 of the epitaxial layer 4 constitutes a drift layer 11 of the MOSFET 100. The buffer layer is defined as a region of the epitaxial layer 4 where a depletion layer does not extend during device operation. The drift layer 11 is defined as a region (an active layer) of the epitaxial layer 4 where a depletion layer extends during the device operation.

Upon the MOSFET 100 turning into an off-state, the depletion layer extends in the third epitaxial layer 43, which is the drift layer 11. This maintains a voltage applied between a source electrode 2 and a drain electrode 19. The thickness of the drift layer 11 (a vertical dimension in FIG. 2) is determined in accordance with a required breakdown voltage and various required properties for a power device. An example of the thickness is the order of 3 to 200 μm. Moreover, the impurity concentration of the drift layer 11 is determined in accordance with the required breakdown voltage and the various required properties for the power device. An example of the impurity concentration is the order of $1 \times 10^{17}$ cm$^{-3}$. It is noted that the first epitaxial layer 41 and the second epitaxial layer 42 will be detailed later on.

The third epitaxial layer 43 or the drift layer 11 has a top layer selectively provided with a well region 14, which is an impurity region of a second conductivity type (herein a p-type). The well region 14 is thinner than the drift layer 11. The p-type well region 14 and the n-type drift layer 11 form a pn diode structure.

The well region 14 has a top layer selectively provided with a source region 15 of a first conductivity type and a well contact region 16 of a second conductivity type having a higher impurity concentration than the well region 14. The top layer of the well region 14 has a region sandwiched between the source region 15 and the drift layer 11. The sandwiched region constitutes a channel region of the MOSFET 100. The source region 15 is, for instance, formed around the surroundings of the well contact region 16 in plan view.

Disposed on the upper surface of the epitaxial layer 4 is a gate insulating film 12 extending from the upper surface of the source region 15 through the upper surface of the drift layer 11 so as to cover the channel region. Disposed on the gate insulating film 12 is a gate electrode 13. The gate electrode 13 faces the channel region through the gate insulating film 12. FIG. 2 illustrates the gate insulating film 12 extending astride two adjacent MOSFET cells.

Disposed on the gate electrode 13 is an interlayer insulating film 17. Disposed on the interlayer insulating film 17 is the source electrode 2. The interlayer insulating film 17 and the gate insulating film 12 have contact holes that reach the source region 15 and the well contact region 16. The source electrode 2 is connected to the well region 14 and the source region 15 via the contact holes. Thus, the source electrode 2 is electrically connected to the source region 15, and also electrically connected to the well region 14 through the well contact region 16 having low resistance.

As illustrated in FIG. 1, the source electrode 2 has a portion exposed to the upper surface of the MOSFET 100. This portion functions as a source pad. Disposed also on the interlayer insulating film 17 is a gate pad 1 (not shown in FIG. 2) connected to the gate electrode 13 via the contact holes. The drain electrode 19 is disposed on the lower surface of the single-crystal substrate 10 (a surface remote from the epitaxial layer 4). The gate pad 1, the source electrode 2, and the drain electrode 19 are made of, for instance, aluminum.

In the cell region of the MOSFET 100, a plurality of MOSFET cells each having the structure shown in FIG. 2 are periodically arranged. These MOSFET cells are connected to each other in parallel, thereby forming a transistor array structure.

Figure 3:
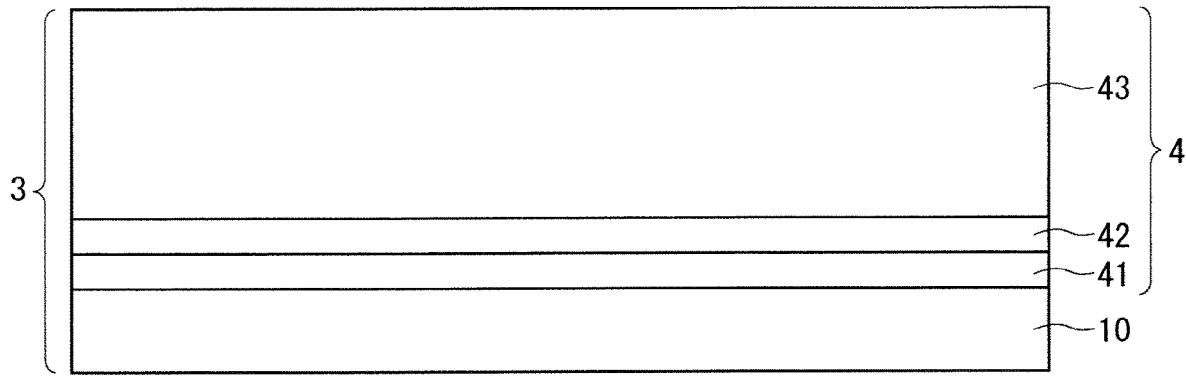
FIG. 3 is a diagram of the configuration of an epitaxial substrate according to the embodiment of the present invention.
Figure 4:
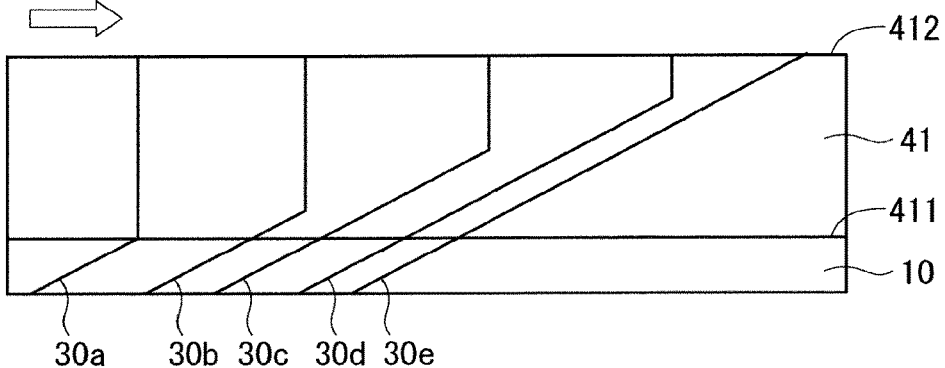
FIG. 4 is a cross-sectional view of an example of basal plane dislocations in a first epitaxial layer.
Figure 5:
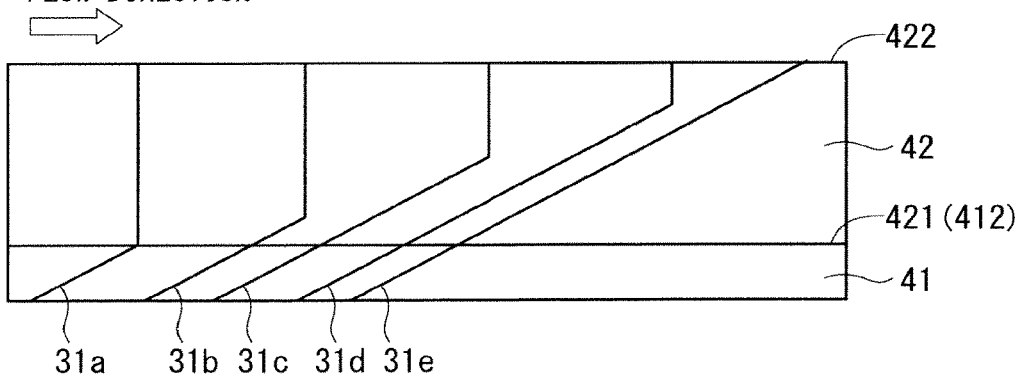
FIG. 5 is a cross-sectional view of an example of basal plane dislocations in a second epitaxial layer.

The following details the first epitaxial layer 41 and the second epitaxial layer 42 of the epitaxial layer 4 with reference to FIGS. 3 to 5. FIG. 3 is a diagram illustrating the configuration of the epitaxial substrate 3 used in the production of the MOSFET 100.

As earlier described, the epitaxial substrate 3 is composed of the single-crystal substrate 10 of silicon carbide and the epitaxial layer 4 of silicon carbide disposed thereon. The epitaxial layer 4 has a stacked structure including the first epitaxial layer 41 disposed on the single-crystal substrate 10, the second epitaxial layer 42 disposed on the first epitaxial layer 41, and the third epitaxial layer 43 disposed on the second epitaxial layer 42.

The epitaxial substrate 3 has a hexagonal, crystalline structure. An example of polytypes is 4H. The single-crystal substrate 10 has an impurity concentration of $3 \times 10^{18}$ cm$^{-3}$ or more. The upper surface of the single-crystal substrate 10 has a plane orientation with an off-angle of 1° or more and 8° or less.

Let the number of basal plane dislocations included in the lower surface of the first epitaxial layer 41 be a. Then, the first epitaxial layer 41 is defined as a layer whose upper surface has a×0.05 or more number of basal plane dislocations and a or less number of basal plane dislocations, and more preferably, as a layer whose upper surface has a×0.1 or more number of basal plane dislocations and a or less number of basal plane dislocations. Let the number of basal plane dislocations included in the lower surface of the second epitaxial layer 42 be b. Then, the second epitaxial layer 42 is defined as a layer whose upper surface has b×0.02 or less number of basal plane dislocations, and more preferably, as a layer whose upper surface has b×0.01 or less number of basal plane dislocations. Herein, the "lower surface" of each layer in the epitaxial layer 4 is an interface adjacent to the single-crystal substrate 10; and the "upper surface" of the same, an opposite interface. In addition, the basal plane dislocations included in the lower surface of each layer are basal plane dislocations entering the inside of the layer from the lower surface; and the basal plane dislocations in the upper surface of each layer are basal plane dislocations going out of the inside of the layer to the upper surface.

FIG. 4 illustrates an example of the basal plane dislocations in the first epitaxial layer 41. Many basal plane dislocations enter the first epitaxial layer 41, grown on the single-crystal substrate 10, from the single-crystal substrate 10. Reference is made to basal plane dislocations 30a to 30e within the single-crystal substrate 10 in FIG. 4. The basal plane dislocation 30a changes into an edge dislocation at the lower surface, 411, of the first epitaxial layer 41 (i.e., the interface between the first epitaxial layer 41 and the single-crystal substrate 10), and then fails to enter the inside of the first epitaxial layer 41. Meanwhile, the basal plane dislocations 30b to 30e enter the inside the first epitaxial layer 41 from the lower surface 411 of the first epitaxial layer 41. Among the basal plane dislocations 30b to 30e as entered the inside of the first epitaxial layer 41, the basal plane dislocations 30b to 30d change into edge dislocations at a lower layer portion, a middle layer portion, or an upper layer portion within the first epitaxial layer 41, and then go out to the upper surface, 412, of the first epitaxial layer 41. Further, the basal plane dislocation 30e goes out to the upper surface 412 of the first epitaxial layer 41 without converting into an edge dislocation, and thus passes through the first epitaxial layer 41.

In FIG. 4, the basal plane dislocations 30b, 30c, and 30d have been converted into the edge dislocations by the first epitaxial layer 4, and the basal plane dislocation 30e has not been converted into the edge dislocation by the first epitaxial layer 41. It is noted that the basal plane dislocation 30a, which has changed into the edge dislocation at the lower surface 411 of the first epitaxial layer 41, is regarded as being absent from the lower surface 411 of the first epitaxial layer 41, and is thus not counted as a basal plane dislocation included in the lower surface 411.

As such, the language, "Let the number of basal plane dislocations included in the lower surface of the first epitaxial layer 41 be a. Then, the first epitaxial layer 41 is defined as a layer whose upper surface has a×0.05 or more number of basal plane dislocations and a or less number of basal plane dislocations", has the following meaning: When the number of basal plane dislocations that has entered the first epitaxial layer 41 from its lower surface is a, the number of basal plane dislocations that are not converted into edge dislocations by the first epitaxial layer 41 is a×0.05 or more and a or less. This language, conversely, means that less than a×0.95 number of basal plane dislocations are converted into edge dislocations within the first epitaxial layer 41. In other words, the first epitaxial layer 41 has a basal-plane-dislocation conversion rate of less than 95%.

FIG. 5 illustrates an example of the basal plane dislocations in the second epitaxial layer 42. The basal plane dislocations enters the second epitaxial layer 42, grown on the first epitaxial layer 41, from the first epitaxial layer 41. Like the above description, let the number of basal plane dislocations included in the lower surface 411 of the first epitaxial layer 41 be a. Then, a×0.05 or more number of basal plane dislocations reach the upper surface 412 of the first epitaxial layer 41. Accordingly, a×0.05 or more number of basal plane dislocations enter the inside of the second epitaxial layer 42 from the lower surface, 421, of the second epitaxial layer 42.

Reference is made to basal plane dislocations 31a to 31e included in the upper surface 412 of the first epitaxial layer 41 in FIG. 5. The basal plane dislocation 31a changes into an edge dislocation at the lower surface 421 of the second epitaxial layer 42 (i.e., the interface between the first epitaxial layer 41 and the second epitaxial layer 42), and then fails to enter the inside of the second epitaxial layer 42. Meanwhile, the basal plane dislocations 31b to 31e enter the inside of the second epitaxial layer 42 from the lower surface 421 of the second epitaxial layer 42. Among the basal plane dislocations 31b to 31e as entered the inside of the second epitaxial layer 42, the basal plane dislocations 31b to 31d change into edge dislocations at a lower layer portion, a middle layer portion, or an upper layer portion within the second epitaxial layer 42, and then go out to the upper surface, 422, of the second epitaxial layer 42. Further, the basal plane dislocation 31e goes out to the upper surface 422 of the second epitaxial layer 42 without converting into an edge dislocation, and thus passes through the second epitaxial layer 42.

In FIG. 5, the basal plane dislocations 31b, 31c, and 31d have been converted into the edge dislocations by the second epitaxial layer 4, and the basal plane dislocation 31e has not been converted into the edge dislocation by the second epitaxial layer 42. It is noted that the upper surface 412 of the first epitaxial layer 41 and the lower surface 421 of the second epitaxial layer 42 are on the same plane. It is also noted that although the basal plane dislocation 31a, which has changed into the edge dislocation at the lower surface 421 of the second epitaxial layer 42, is included in the upper surface 422 of the second epitaxial layer 42, the basal plane dislocation 31a is regarded as being absent from the lower surface 421 of the second epitaxial layer 42, and is thus not counted as a basal plane dislocation included in the lower surface 421.

As such, the language, "Let the number of basal plane dislocations included in the lower surface of the second epitaxial layer 42 be b. Then, the second epitaxial layer 42 is defined as a layer whose upper surface has b×0.02 or less number of basal plane dislocations", has the following meaning: When the number of basal plane dislocations that have entered the second epitaxial layer 42 from its lower surface is b, the number of basal plane dislocations that are not converted into edge dislocations by the second epitaxial layer 42 is b×0.02 or less. This language, conversely, means that more than b×0.98 number of basal plane dislocations are converted into edge dislocations within the second epitaxial layer 42. In other words, the second epitaxial layer 42 has a basal-plane-dislocation conversion rate of more than 98%.

When the number of basal plane dislocations included in the lower surface 411 of the first epitaxial layer 41 is a, the upper surface 422 of the second epitaxial layer 42 is set to have a×0.001 or less number of basal plane dislocations. This means that the first epitaxial layer 41 and the second epitaxial layer 42 convert 99.9% or more of the basal plane dislocations within the single-crystal substrate 10. In other words, 0.1% or less of the basal plane dislocations included in the single-crystal substrate 10 enter the third epitaxial layer 43.

As describes above, the epitaxial substrate 3 according to the present embodiment includes the third epitaxial layer 43 disposed on the first epitaxial layer 41 and the second epitaxial layer 42, both of which convert the basal plane dislocations within the single-crystal substrate 10 into the edge dislocations. The first epitaxial layer 41 and the second epitaxial layer 42 convert the basal plane dislocations within the single-crystal substrate 10 into the edge dislocations in two steps. This reduces, in the third epitaxial layer 43, unfavorable dislocations originating extended stacking faults. The MOSFET 100 is produced using the epitaxial substrate 3 according to the present embodiment. Consequently, provided is the drift layer 11 with few unfavorable dislocations originating expanded stacking faults. This prevents property degradation resulting from the energization of a body diode in the MOSFET 100.

The following describes a mechanism through which the basal plane dislocations are converted into the edge dislocations in two steps, and another mechanism that prevents energization degradation using the mechanism.

As understood from the above description, the essence of the present invention lies in the epitaxial layer 4 having a stacked structure composed of multiple layers with different conversion rates of basal plane dislocation from each other. More specifically, the essence lies in stacking the second epitaxial layer 42 with a higher basal-plane-dislocation conversion rate onto the first epitaxial layer 41 with a lower basal-plane-dislocation conversion rate. Consequently, the basal plane dislocations convert into the edge dislocations in two steps. This reduces not only the basal plane dislocations, but also other unfavorable dislocations originating expanded stacking faults, thereby preventing degradation resulting from the energization of a bipolar device.

The conversion of basal plane dislocations through multiple-layer epitaxial growth is commonly known to occur at the interfaces between layers. This is because a stress resulting from differences in impurity concentration occurs at the interfaces between the layers, and the stress thus converts the basal plane dislocations into edge dislocations. Such interface dislocations as produced by the stress unfortunately involve another problem: device energization.

Meanwhile, the basal plane dislocations convert into the edge dislocations also within each layer. This is because the interaction in proceeding between the basal plane dislocations and the epitaxial growth, as well, causes the conversion of the basal plane dislocations (e.g., Non-Patent Document 3). A greater angle formed by a proceeding direction of basal plane dislocation and a proceeding direction of epitaxial growth produces a greater degree of interaction. Hence, the basal plane dislocations tend to convert into the edge dislocations.

Typical epitaxial growth on a silicon carbide substrate having an off-angle proceeds through two growth modes: step flow growth on a silicon carbide single crystal, and two-dimensional nucleus growth. The step flow growth mode is a growth mode in which a step end takes in material atoms as supplied for proceeding, and proceeds in parallel with a step flow direction. The two-dimensional nucleus growth mode is a growth mode in which two-dimensional nuclei are formed in a terrace region on the silicon carbide single-crystal substrate having an off-angle, and this growth mode proceeds toward its periphery using the two-dimensional nuclei. The two-dimensional nucleus growth mode, which has a growth component perpendicular to the step flow direction, can be also referred to as "lateral growth".

Between the two growth modes, the occurrence rate of two-dimensional nucleus growth mode affects the conversion rate of basal plane dislocation to a great degree. To be specific, a low occurrence rate of two-dimensional nucleus growth lowers the conversion rate of basal plane dislocation; moreover, a high occurrence rate of two-dimensional nucleus growth remarkably enhances the conversion rate of basal plane dislocation. This is because the proceeding direction of the basal plane dislocations that have entered an epitaxial layer is different from the proceeding direction of the epitaxial growth; consequently, an interaction acts on the basal plane dislocations. The term, "a high occurrence rate of two-dimensional nucleus growth", herein does not mean that the two-dimensional nucleus growth mode predominates over the step flow growth mode, but the term means that the occurrence rate of two-dimensional nucleus growth mode is relatively higher than typical conditions for growth.

Meanwhile, the basal plane dislocations entering the epitaxial layer proceed at various angles with respect to the step flow direction. Accordingly, the conversion rate of basal plane dislocation varies in accordance with proceeding directions of the basal plane dislocations. In one example, the proceeding direction of the basal plane dislocations can be parallel with the step flow direction. This provides a small degree of interaction between the proceeding of the basal plane dislocations and the step flow growth, thus involving a low rate of conversion into edge dislocations. In another example, the proceeding direction of the basal plane dislocations can have a large angle with respect to the step flow direction. This provides a large degree of interaction between the proceeding of the basal plane dislocations and the step flow growth, thus involving a high rate of conversion.

Nevertheless, the epitaxial layer can have a surface provided with a basal plane dislocation having a large angle with respect to step flow in a growth condition with a high occurrence rate of two-dimensional nucleus growth mode. Then, the basal plane dislocation, which receives interactions from the step flow growth mode and the two-dimensional nucleus growth mode, does not entirely convert into an edge dislocation in some rare cases, thus forming an unfavorable dislocation with a combined property of the basal plane dislocation and the edge dislocation. This unfavorable dislocation is less likely to convert depending on epitaxial growth coming afterward, and proceeds further until reaching an upper, drift layer (the third epitaxial layer 43). Such a dislocation within the drift layer originates an expanded stacking fault, thereby causing device degradation. The term, "a large angle with respect to step flow", herein is, to be specific, an angle of 50° or more formed by the step flow direction and the proceeding direction of the basal plane dislocations. Moreover, the term, "a dislocation with a combined property of the basal plane dislocation and the edge dislocation", herein is, to be specific, a dislocation proceeding at an angle of 10° or more and 80° or less with respect to a basal plane. Such a dislocation mostly proceeds at an angle of 15° or more and 50° or less.

The epitaxial substrate 3 according to the present embodiment is effective for reducing dislocations with a combined property of a basal plane dislocation and an edge dislocation. The first epitaxial layer 41 is formed in a growth condition with a low basal-plane-dislocation conversion rate. This conversion rate is less than 95%, and is more preferably less than 90%. Growth in such a condition involves a low occurrence rate of two-dimensional nucleus growth mode. Thus, almost all growth components are presumably formed in the step flow growth mode. At this time, the interaction with the step flow growth enables the proceeding direction of a basal plane dislocation having a large angle with respect to the step flow to bend in the step flow direction. At this stage, the basal plane dislocations included in the interface between the first epitaxial layer 41 and the second epitaxial layer 42 and included in the second epitaxial layer 42 preferably forms, together with the step flow direction, an angle of ±45° or less. The basal plane dislocations and the step flow direction form an angle of ±45° or less. Accordingly, the basal plane dislocations are unlikely to receive interactions from the step flow growth mode and the two-dimensional nucleus growth mode when the second epitaxial layer 42 is formed. This prevents an unfavorable dislocation with a combined property of the basal plane dislocation and the edge dislocation. If the basal plane dislocations and the step flow direction form an angle of more than ±45°, the basal plane dislocations tend to receive the interactions from the step flow growth mode and the two-dimensional nucleus growth mode. This fails to effectively prevent the unfavorable dislocation.

The second epitaxial layer 42 is formed in a growth condition with a high basal-plane-dislocation conversion rate. This conversion rate is more than 98%, and is more preferably more than 99%. This allows almost all the basal plane dislocations that have not converted to convert in the first epitaxial layer 41. That is, the second epitaxial layer 42 enables the basal plane dislocation, whose proceeding direction has bent in the first epitaxial layer 41, to convert into the edge dislocation. If the second epitaxial layer 42 has a basal-plane-dislocation conversion rate of 98% or less, the basal plane dislocations cannot entirely convert, thereby possibly causing the device degradation.

As described above, the present embodiment enables the proceeding direction of the basal plane dislocation within the single-crystal substrate 10, having a large angle with respect to the step flow direction, to bend in a direction parallel to the step flow direction in the first epitaxial layer 41, and enables the basal place dislocation to convert into the edge dislocation in the second epitaxial layer 42. This prevents the basal plane dislocation, having a large angle with respect to the step flow direction, from converting into the unfavorable dislocation with the combined property of the edge dislocation and the basal plane dislocation.

The first epitaxial layer 41 does not have a uniquely limited thickness, but desirably has a thickness of 0.01 µm or more and 30 µm or less for productivity. The first epitaxial layer 41 does not have a uniquely limited concentration, but desirably has a thickness of $1 \times 10^{16}$ cm$^{-3}$ or more and $1 \times 10^{19}$ cm$^{-3}$ or less. The second epitaxial layer 42 does not have a uniquely limited thickness, but desirably has a thickness of 0.01 µm or more and 30 µm or less for the productivity. The second epitaxial layer 42 does not have a uniquely limited concentration, but desirably has a thickness of $1 \times 10^{16}$ cm$^{-3}$ or more and $1 \times 10^{19}$ cm$^{-3}$ or less. The first epitaxial layer 41 and the second epitaxial layer 42 may have the same thickness and the same concentration. Alternatively, these layers may have different thicknesses from each other and different concentrations from each other.

The essence of the present invention lies in the epitaxial layer 4 having a stacked structure composed of multiple layers with different conversion rates of basal plane dislocation from each other. Basically, the impurity concentration of each layer does not change the effect obtained by the stacked structure. Nevertheless, no extreme difference in impurity concentration is desirable between the first epitaxial layer 41 and the second epitaxial layer 42, because a stress resulting from differences in impurity concentration between the layers produces an interface dislocation. Moreover, the impurity concentration of the first epitaxial layer 41 is desirably higher than the impurity concentration of the second epitaxial layer 42; in addition, the impurity concentration of the second epitaxial layer 42 is desirably higher than the impurity concentration of the third epitaxial layer 43. To be specific, the first epitaxial layer 41 and the second epitaxial layer 42 are each preferably set to have an impurity concentration that satisfies 0.01≤Nb/Na≤1, where Na is the impurity concentration of the first epitaxial layer 41, where Nb is the impurity concentration of the second epitaxial layer 42. Setting the impurity concentrations so as to satisfy this condition effectively prevents the stress, resulting from the differences in impurity concentration. Setting the impurity concentrations of the first epitaxial layer 41 and the second epitaxial layer 42 so as not to satisfy this condition produces an extremely large difference in impurity concentration between the first epitaxial layer 41 and the second epitaxial layer 42. Consequently, a stress resulting from the extremely large difference is difficult to effectively prevent.

The layers, constituting the epitaxial layer 4, each do not need to have a uniform impurity concentration, and thus each may have an impurity concentration varying in its thickness direction as necessary. For instance, the impurity concentration in the lower surface of the first epitaxial layer 41 may be the same order of degree as the impurity concentration of the single-crystal substrate 10, and may gradually decrease along with the growth of the first epitaxial layer 41, so that the impurity concentration in the upper surface of the first epitaxial layer 41 is the same order of degree as the impurity concentration in the lower surface of the second epitaxial layer 42. Furthermore, the impurity concentration may gradually decrease along with the growth of the second epitaxial layer 42, so that the impurity concentration in the upper surface of the second epitaxial layer 42 is the same order of degree as the impurity concentration in the lower surface of the third epitaxial layer 43. Doing so provides an extremely small stress resulting from the differences in impurity concentration, and prevents the interface dislocation, thereby effectively achieves the effect of the present invention.

The following describes a method for producing the epitaxial substrate 3 according to the present embodiment, that is, a method for forming the epitaxial layer 4 onto the single-crystal substrate 10.

The epitaxial layer 4 is formed onto the single-crystal substrate 10 through Chemical Vapor Deposition (CVD). In CVD, hydrogen ($H_2$) is used as a carrier gas; moreover, a silicon-containing gas represented by silane ($SiH_4$) and disilane ($Si_2H_6$), and a carbon-containing gas represented by propane ($C_3H_8$) and methane ($CH_4$) are used as raw material gases. Further, nitrogen ($N_2$) is added as an impurity dopant gas. The single-crystal substrate 10 is placed within a reactor and heated to 1400 to 1800° C. Then, the carrier gas, the raw material gases, and the dopant gas are introduced to the reactor. Consequently, the epitaxial layer 4 is grown onto the single-crystal substrate 10. At this stage, a halide-containing gas may be used for an enhanced growth speed.

Different steps of growing the layers need to use different growth conditions in order for the epitaxial layer 4 to have a stacked structure composed of the first epitaxial layer 41, the second epitaxial layer 42, and the third epitaxial layer 43. That is, the first epitaxial layer 41 needs to be grown onto the single-crystal substrate 10 using a first growth condition; then, the second epitaxial layer 42 needs to be grown using a second growth condition; further the third epitaxial layer 43 needs to be grown using a third growth conduction.

As earlier described, in silicon-carbide epitaxial growth, increasing or reducing the occurrence rate of two-dimensional nucleus growth during the epitaxial growth is important to change the basal-plane-dislocation conversion rate. The occurrence rate of two-dimensional nucleus generation is controlled by regulating conditions during the epitaxial growth, specifically, by regulating C/Si ratio, growth temperature, growth pressure, growth speed, and carrier gas flow. For instance, lowering the C/Si ratio, which is the supply flow ratio of the silicon-containing gas to the carbon-containing gas, prevents two-dimensional nucleus generation; conversely, raising the C/Si increases the occurrence rate of two-dimensional nucleus growth. Moreover, a higher growth temperature provides a lower occurrence rate of two-dimensional nucleus growth.

As such, one or more conditions among the C/Si ratio, the growth temperature, the growth pressure, and growth speed are different between the first, second, and third growth conditions. For the change of the growth temperature and growth pressure, a desirable transition to the next growth step is to pause the supply of the raw material gases in the intervals between the steps of growing the individual layers, to completely change the growth temperature and the growth pressure into a desirable growth temperature and a desirable growth pressure, and then to resume growth. This is because a thermal stress forms an additional dislocation, such as an interface dislocation, if, for instance, a temperature condition is changed with the growth going on.

For instance, at first, the first epitaxial layer 41 is grown until having a desired thickness using a first C/Si ratio, a first growth temperature, a first growth speed, and a first growth pressure, followed by the supply suspension of the raw material gases. Then, a complete change into a second growth temperature and a second growth pressure comes, followed by the supply resumption of the row material gases that have been regulated to have a second C/Si ratio and a second growth speed, thereby starting the growth of the second epitaxial layer 42. Thereafter, upon the second epitaxial layer 42 having a desired thickness, the supply of the raw material gases is again stopped. Then, a complete change into a third growth temperature and a third growth pressure comes, followed by the supply resumption of the raw material gases that have been regulated to have a third C/Si ratio and the third growth temperature, thereby growing the third epitaxial layer 43.

For instance, raising the second C/Si ratio further than the first C/Si ratio regulates the occurrence rate of two-dimensional nucleus growth, thereby enabling the first epitaxial layer 41 to a basal-plane-dislocation conversion rate of less than 95%, and enabling the second epitaxial layer 42 to have a basal-plane-dislocation conversion rate of more than 98%. For instance, lowering the second growth temperature further than the first growth temperature regulates the occurrence rate of two-dimensional nucleus growth, thereby enabling the first epitaxial layer 41 to have a basal-plane-dislocation conversion rate of less than 95%, and enabling the second epitaxial layer 42 to have a basal-plane-dislocation conversion rate of more than 98%. Furthermore, these two parameters may change at the same time. Alternatively, further other parameters may change.

It is noted that since the basal-plane-dislocation conversion rate varies due to various factors, such as the C/Si ratio, the growth temperature, the growth speed, and the growth pressure during the epitaxial growth, and the structure of a growth unit, the conditions of growing the individual layers cannot be uniformly limited. The aforementioned configuration of the epitaxial substrate and the aforementioned structure of the silicon carbide semiconductor device sufficiently achieve the effect of the present invention.

The method for producing the epitaxial substrate 3 according to the present embodiment enables the first epitaxial layer 41, the second epitaxial layer 42, and the third epitaxial layer 43, which constitute the epitaxial layer 4, to grow in the same unit. This provides the epitaxial substrate 3 according to the present invention without a large reduction in throughput. Further, the third growth speed is higher than the first and second growth speeds. This further enhances the productivity. Still further, the supply of the raw material gases pauses in the intervals between the steps of growing the individual layers of the epitaxial layer 4. This reduces the thermal stress, thereby preventing the interface dislocation and other dislocations.

FIG. 2 illustrates that the epitaxial layer 4 has a three-ply structure composed of the first epitaxial layer 41, the second epitaxial layer 42, and the third epitaxial layer 43. FIG. 2 also illustrates that the first epitaxial layer 41 and the second epitaxial layer 42 constitute the buffer layer, and that the third epitaxial layer 43 constitutes the drift layer 11. That is, FIG. 2 illustrates that a device structure is formed in the third epitaxial layer 43. The epitaxial layer 4 may include four or more layers.

For instance, FIG. 6 illustrates an example of the epitaxial substrate 3 when including the epitaxial layer 4 with a four-ply structure. That is, in FIG. 6, the epitaxial layer 4 includes the first epitaxial layer 41 disposed on the single-crystal substrate 10, the second epitaxial layer 42 disposed on the first epitaxial layer 41, and the third epitaxial layer 43 disposed on the second epitaxial layer 42, and a fourth epitaxial layer 44 disposed on the third epitaxial layer 43.

In this example, the fourth epitaxial layer 44 serves as the drift layer 11, and a device structure is formed in the drift layer 11. Moreover, the third epitaxial layer 43 functions as a buffer layer. Here, the third epitaxial layer 43 needs to have a higher impurity concentration than the fourth epitaxial layer 44. In this way, the third epitaxial layer 43, having a higher impurity concentration, is disposed under the fourth epitaxial layer 44, constituting the drift layer 11. This enables a region having rejoined carriers to be physically separated from a region having an unfavorable dislocation, thereby preventing stacking fault expansion.

While the embodiment about the silicon carbide semiconductor device and the silicon carbide epitaxial substrate has been detailed, the embodiment is an illustration of one aspect to which the present invention can be applied; thus the scope of application of the present invention is not restrictive.

That is, the embodiment can be modified and omitted as appropriate, within the scope of the invention.

EXPLANATION OF REFERENCE SIGNS 3 epitaxial substrate, 4 epitaxial layer, 10 single-crystal substrate, 11 drift layer, 12 gate oxide insulating film, 13 gate electrode, 14 well region, 15 source region, 16 well contact region, 17 interlayer insulating film, 19 drain electrode, 41 first epitaxial layer, 42 second epitaxial layer, 43 third epitaxial layer, 44 fourth epitaxial layer, 411 lower surface of first epitaxial layer, 412 upper surface of first epitaxial layer, 421 lower surface of second epitaxial layer, 422 upper surface of second epitaxial layer, 30a to 30e, 31 to 31e basal plane dislocation.

The invention claimed is:

1. A silicon carbide epitaxial substrate comprising:
a silicon carbide single-crystal substrate;
a first epitaxial layer disposed on the silicon carbide single-crystal substrate;
a second epitaxial layer disposed on the first epitaxial layer; and
a third epitaxial layer disposed on the second epitaxial layer,
wherein when the number of basal plane dislocations included in a lower surface of the first epitaxial layer is a, an upper surface of the second epitaxial layer includes a×0.001 or less number of basal plane dislocations, and
the first epitaxial layer has a basal-plane-dislocation conversion rate lower than a basal-plane-dislocation conversion rate in the second epitaxial layer.

2. The silicon carbide epitaxial substrate according to claim 1, wherein
the first epitaxial layer has a basal-plane-dislocation conversion rate of less than 95%, and
the second epitaxial layer has a basal-plane-dislocation conversion rate of more than 98%.

3. The silicon carbide epitaxial substrate according to claim 1, wherein the first epitaxial layer and the second epitaxial layer have an impurity concentration of $1\times10^{16}$ cm$^{-3}$ or more and $1\times10^{19}$ cm$^{-3}$ or less.

4. The silicon carbide epitaxial substrate according to claim 1, wherein $0.01 \leq Nb/Na \leq 1$ is satisfied, wherein Na is an impurity concentration of the first epitaxial layer, wherein Nb is an impurity concentration of the second epitaxial layer.

5. A silicon carbide semiconductor device comprising the silicon carbide epitaxial substrate according to claim 1.

6. The silicon carbide semiconductor device according to claim 5, wherein
the first epitaxial layer and the second epitaxial layer constitute a buffer layer, and
the third epitaxial layer constitutes a drift layer.

7. A silicon carbide epitaxial substrate comprising:
a silicon carbide single-crystal substrate;
a first epitaxial layer disposed on the silicon carbide single-crystal substrate;
a second epitaxial layer disposed on the first epitaxial layer; and
a third epitaxial layer disposed on the second epitaxial layer,
wherein when the number of basal plane dislocations included in a lower surface of the first epitaxial layer is a, an upper surface of the second epitaxial layer includes a×0.001 or less number of basal plane dislocations, wherein
a basal plane dislocation and a step flow direction forms an angle of ±45° or less, the basal plane dislocation being included in an interface between the first epitaxial layer and the second epitaxial layer, and in the second epitaxial layer.

8. A silicon carbide semiconductor device comprising:
a silicon carbide epitaxial substrate, the silicon carbide epitaxial substrate including
a silicon carbide single-crystal substrate;
a first epitaxial layer disposed on the silicon carbide single-crystal substrate;
a second epitaxial layer disposed on the first epitaxial layer;
a third epitaxial layer disposed on the second epitaxial layer; and
a fourth epitaxial layer disposed on the third epitaxial layer and having a lower impurity concentration than the third epitaxial layer,
when the number of basal plane dislocations included in a lower surface of the first epitaxial layer is a, an upper surface of the second epitaxial layer includes a×0.001 or less number of basal plane dislocations, the first epitaxial layer, the second epitaxial layer, and the third second epitaxial layer constitute a buffer layer, and the fourth epitaxial layer constitutes a drift layer.

\* \* \* \* \*